US011067905B1

(12) United States Patent
Valverde-Paniagua et al.

(10) Patent No.: US 11,067,905 B1
(45) Date of Patent: Jul. 20, 2021

(54) REAL-TIME AUTOFOCUS FOR MASKLESS LITHOGRAPHY ON SUBSTRATES

(71) Applicant: Applied Materials, Inc., Santa Clara, CA (US)

(72) Inventors: Diana Valverde-Paniagua, Sunnyvale, CA (US); Zhongchuan Zhang, Fremont, CA (US); Rendong Lin, San Jose, CA (US); Zheng Gu, Emeryville, CA (US); Meenaradchagan Vishnu, San Jose, CA (US); Glen Alan Gomes, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/058,529

(22) PCT Filed: Apr. 9, 2019

(86) PCT No.: PCT/US2019/026445
§ 371 (c)(1),
(2) Date: Nov. 24, 2020

(87) PCT Pub. No.: WO2020/005361
PCT Pub. Date: Jan. 2, 2020

Related U.S. Application Data

(60) Provisional application No. 62/692,323, filed on Jun. 29, 2018.

(51) Int. Cl.
*G03F 7/20* (2006.01)
(52) U.S. Cl.
CPC ...... *G03F 7/70641* (2013.01); *G03F 7/70358* (2013.01); *G03F 7/70716* (2013.01)

(58) Field of Classification Search
CPC ....... G03F 7/70641; G03F 7/20; G03F 9/7026
(Continued)

(56) References Cited

U.S. PATENT DOCUMENTS

| 4,886,958 A | 12/1989 | Merryman et al. |
| 6,444,995 B1 * | 9/2002 | Cho ............... G03F 9/7026 |
| | | 250/201.2 |
| 2005/0218231 A1 | 10/2005 | Massieu |

FOREIGN PATENT DOCUMENTS

| JP | H08045813 A | 2/1996 |
| JP | 2014-222291 A | 11/2014 |
| KR | 2018-0060786 A | 6/2018 |

OTHER PUBLICATIONS

Taiwan Office Action dated Jan. 20, 2021 for Application No. 108114323.

(Continued)

*Primary Examiner* — Hung Nguyen
(74) *Attorney, Agent, or Firm* — Patterson + Sheridan LLP

(57) ABSTRACT

Embodiments of the systems and methods discussed herein autofocus an imaging apparatus by pre-processing image data received via channels of the imaging system that include laser beams and sensors configured to receive image data when laser beams are applied across a substrate in a pixel-wise application across a substrate. The substrate can include both a photoresist and metallic material, and the images as-received by the sensors include noise from the metallic material. During pre-processing of the image data, a percentage of noise to remove from the image data is determined, and the image data is filtered. A centroid of the substrate is calculated for each channel and a focus deviation for the exposure is determined. The centroids can be combined using one or more filtering mechanisms, and the imaging system can be autofocused in an exposure position (Continued)

by moving the stage and/or the exposure source in one or more directions.

15 Claims, 8 Drawing Sheets

(58) Field of Classification Search
USPC .......................................... 355/52, 53, 55, 77
See application file for complete search history.

(56) References Cited

OTHER PUBLICATIONS

International Search Report and Written Opinion, PCT/US2019/026445, dated Jul. 26, 2019.

* cited by examiner

REAL-TIME AUTOFOCUS FOR MASKLESS LITHOGRAPHY ON SUBSTRATES

BACKGROUND

Field

Embodiments of the present disclosure generally relate to apparatuses, systems and methods for processing one or more substrates, and more specifically to apparatuses, systems and methods for performing photolithography processes.

Description of the Related Art

Photolithography is widely used in the manufacturing of semiconductor devices and display devices such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated.

Microlithography techniques have been employed to create electrical features incorporated as part of the liquid crystal material layer forming the pixels. According to these techniques, a light-sensitive photoresist is applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features. The substrates patterned during microlithography can have a variation in thickness across the substrate that is greater than the degrees of freedom of the microlithography system. This can lead to the system being out of focus with respect to the substrate and results in a blurring of one or more pixels in the display which can lead to mura or other undesirable effects in the display.

In order to continue to provide display devices and other devices at the prices demanded by consumers, new apparatuses and approaches are needed to precisely and cost-effectively create patterns on substrates, such as large area substrates, including apparatuses and approaches for real-time autofocusing of the imaging apparatus prior to exposing the substrate.

SUMMARY

In an embodiment, a method of patterning a substrate, comprising: applying a plurality of laser beams across a substrate while the substrate is positioned on a stage in an imaging apparatus in an initial position relative to an exposure source of the imaging apparatus, the substrate comprising a photoresist and a metallic material; receiving, by a plurality of sensors coupled to the imaging apparatus, in response to applying the plurality of laser beams, a plurality of images of each pixel of the plurality of pixels; and determining a percentage of noise in the plurality of images received from each sensor for each pixel of the plurality of pixels in response to the applying of the plurality of laser beams to the metallic material of the substrate. Further in the embodiment, the method comprises: filtering out the percentage of noise from the plurality of images from each sensor for each pixel of the plurality of pixels; subsequently, calculating a centroid of the substrate based on the plurality of images; determining, based on the calculating of the centroid for each sensor of the plurality of sensors, a focus deviation; and adjusting, the substrate to the exposure position from the initial position, the exposure position being different than the initial position, and the adjusting the exposure source autofocusing the exposure source on the substrate.

In an alternate embodiment, a method of patterning a substrate, comprising: positioning, in an imaging apparatus, a substrate comprising a photoresist and a metallic material, the substrate being positioned on a stage in the imaging apparatus in an initial position relative to an exposure source of the imaging apparatus; determining, by an application stored on a non-transitory memory of a server and executable by a processor, an exposure position for the imaging apparatus, the determining the exposure position comprising: applying a plurality of laser beams to each pixel of the plurality of pixels; receiving, by a plurality of sensors coupled to the imaging apparatus, a plurality of images from each pixel of the plurality of pixels in response to applying the plurality of laser beams; determining a percentage of noise of the plurality of images for each sensor for each pixel of the plurality of pixels; and filtering out the percentage of noise from the plurality of images from each sensor for each pixel of the plurality of pixels; subsequently, calculating a centroid of the substrate for each sensor of the plurality of sensors; determining, based on the calculating of the centroid for each sensor of the plurality of sensors, a focus deviation; combining each centroid for each sensor; and determining, based on the combining and the focus deviation, the exposure position of the exposure source. Further in the embodiment, the method comprises adjusting, by the application, at least one of the stage or the exposure source from the initial position to the exposure position, the exposure position being different than the initial position, and the adjusting the exposure source autofocusing the exposure source on the substrate.

In an embodiment, a non-transitory computer-readable medium including instructions that are configured to cause a computing system to: determine an exposure position for an imaging apparatus, the determining the exposure position comprising: apply a plurality of laser beams to each pixel of a plurality of pixels of a substrate; receive, by a plurality of sensors coupled to the imaging apparatus, a plurality of images from each pixel of the plurality of pixels in response to applying the plurality of laser beams; determine a percentage of noise of the plurality of images for each sensor for each pixel of the plurality of pixels; filter out the percentage of noise from the plurality of images from each sensor for each pixel of the plurality of pixels; subsequently, calculate a centroid of the substrate for each sensor of the plurality of sensors; determine, based on the calculation of the centroid for each sensor of the plurality of sensors, a focus deviation; combine each centroid for each sensor; and determine, based on the combination and the focus deviation, the exposure position of the exposure source. Further in the embodiment, the instructions are configured to adjust, by the application, the substrate to the exposure position from the initial position, the exposure position being different than the initial position, and the adjustment of the exposure source autofocuses the exposure source on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
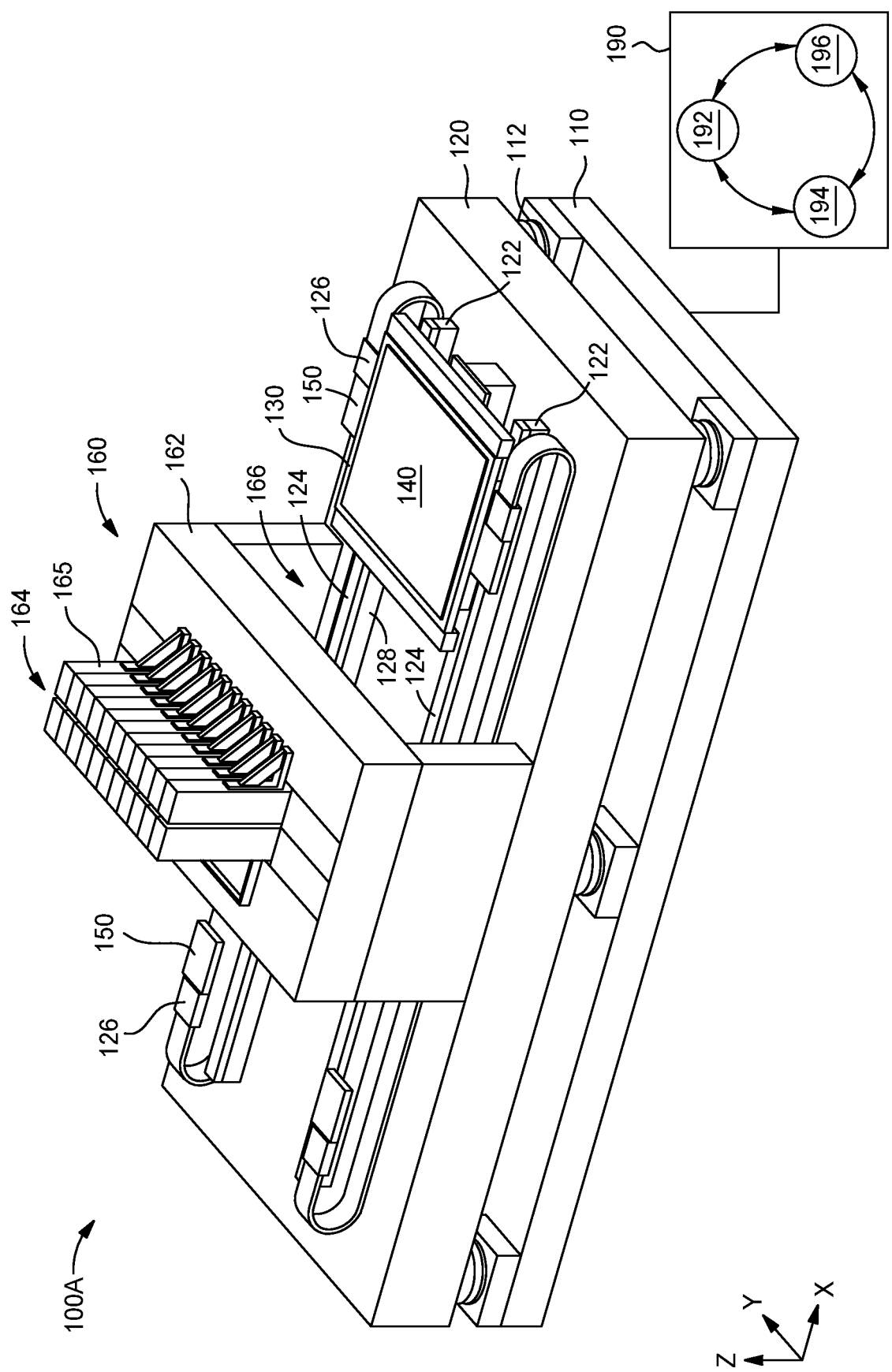
FIG. 1A is a perspective view of a photolithography system according to embodiments disclosed herein.

Embodiments of the present disclosure provide improvements in autofocusing during digital photolithography. Displays of varying sizes can be fabricated using digital photolithography. The digital photolithography systems discussed herein, which can be referred to as imaging systems, use one or more exposure sources comprising solid state emitter devices for operations including patterning photoresists.

Various features of display-sized glass substrates, such as substrate composition and size, make maintaining focus during patterning difficult as compared to maintaining focus while patterning substrates containing only silicon. For example, display substrates can have dimensions of 1500 mm×1850 mm or larger, and can have a highly non-uniform thickness across the substrate. The thickness and the non-uniformity of the thickness across the substrate can be further varied as layers are formed and patterned. The non-uniformity is not able to be removed (smoothed) using chemical mechanical polishing (CMP).

Digital photolithography systems have tight tolerances, for example, +/−3 microns, for focus error due to the small depth-of-focus lenses used for sub-micron printing resolution. The digital photolithography systems tolerance is therefore less than the variation in uniformity across a substrate, which can vary by +/−10 microns or more. Therefore, as substrates increase in size and vary in composition, it becomes harder to autofocus the imaging system.

The systems and methods discussed herein are directed towards autofocusing an imaging apparatus during patterning of a substrate. The autofocusing discussed herein is achieved by positioning the exposure source in an exposure position relative to a substrate. As discussed herein, an "exposure position" is a position of a stage in an imaging apparatus relative to an exposure source of the imaging apparatus, and the stage is a component of an imaging system that is configured to secure a substrate during digital photolithography. The exposure position is determined in real-time by a pixel-wise application. Pixel-wise image processing as discussed herein includes processing a plurality of images. The pixel-wise image processing is used for autofocusing herein, and includes running a routine on a location on a substrate for data received by a sensor and then re-running the same routine (e.g., the substrate height analysis discussed herein) on multiple locations in real-time. In one example, the substrate comprises a plurality of pixels, and the routine is run on each pixel. In this pixel-wise autofocusing operation, a position of the substrate relative to the position of the exposure source is determined using imaging data, including a pre-processing of the imaging data to remove extraneous reflections from the underlying layers, referred to herein as "noise," and improve accuracy of the autofocusing. The autofocus input data used herein is provided via a plurality of linear imaging sensors such as complementary metal oxide semiconductor (CMOS) sensors disposed in the imaging apparatus. The sensors are coupled the imaging apparatus to capture the reflection of the focus lasers off the substrate surface. In one example, a surface of each pixel across a substrate is scanned in real time while the substrate is positioned in the imaging apparatus prior to patterning. On non-patterned metal or glass plates, a CMOS sensor will capture a single Gaussian-like peak associated with the substrate reflection, where the location of the peak indicates the distance of the surface to the sensor. Over a patterned substrate, however, such as a patterned substrate comprising metallic material and a photoresist, metal reflections distort the photoresist reflections in various undesirable ways, which negatively impacts the ability of the system to focus, let alone allow for real-time autofocusing.

The autofocusing discussed herein can be applied to substrates comprising mixed materials such as photoresists and metallic materials by capturing and pre-processing a plurality of images of the substrate. The exposure position can be determined by collecting a plurality of image data from each pixel across a substrate and determining (1) a percentile filter to remove noise from the images due to time-varying metal reflections; as well as (2) a centroid computation to estimate the focus deviation; and (3) a Kalman filter to combine the data from the multiple sensors taken in real time across multiple pixels. This information is combined and used as discussed below to determine an exposure position to autofocus before patterning the substrate. When an exposure position is determined, the imaging apparatus adjusts a stage on which the substrate is positioned and/or the exposure source to the exposure position prior to exposing and patterning the substrate. Thus, autofocus-related mura, an undesirable effect discussed below, is eliminated or reduced using this pixel-wise application.

When an exposure or exposures are performed out of focus on a substrate, an undesirable visual phenomenon called mura occurs. Mura amplifies the microscopic effects of slight focus deviations, leading to defective displays. This challenge is amplified for display substrates with varying compositions, such as when the substrate comprises a photoresist as well as metallic material. When focus beams comprising laser beams are used to determine a position of the exposure source, there will be a difference in the reflection received by sensors in response to the reflection of the laser beams off of the photoresist and the metallic materials. The composition of the substrate, as discussed herein, includes a metallic material and a photoresist, the photoresist is disposed over the metallic material (and other materials that can be formed on the substrate such as dielectric layers) prior to exposure. Using the systems and methods discussed here, a substrate positioned in an imaging apparatus is exposed to the exposure source (i.e., the substrate is patterned). The substrate is exposed when the exposure source is focused on the substrate and is in an exposure position. The exposure position is determined based upon deviations among and between pixel heights across the substrates. Depending upon the embodiment, the stage, the exposure source, or both, can be adjusted along one or more axis to an exposure position subsequent to execution of the methods discussed herein in order to autofocus the imaging system during substrate patterning.

The autofocusing discussed herein allows for the continual adjustment of an imaging system such as a digital lithography system to produce an optimal, focused, exposure for the substrate during one or more exposures during a patterning process that may also be referred to as an etching process. The imaging apparatus comprises a plurality of channels, each channel comprising a laser beam and a sensor such as CMOS sensors. The images discussed herein are comprised of a low-frequency photoresist signal and a time-varying, high-frequency metal signal. Both signals are positive and additive and taking merely the centroid of the signals may not result in a focused exposure because extraneous reflections of the metallic material may cause errors in the centroid calculation. Over time spans from 0.1 ms to 5 ms, such as those used to collect the images discussed herein, the signals from the photoresist have less variation as compared to signals from the metal, which have more variation and add noise to the images. Additionally, the CMOS sensor noise is both positive and negative. Therefore, when the methods discussed herein are used to pre-process the images by removing the noise from the metallic material, the noise from the sensor is not amplified. Thus, this pixel-wise application autofocuses the imaging system prior to exposure by determining an exposure position of the imaging apparatus relative to the substrate based on the height of the pixels across the substrate.

The images collected as discussed herein are filtered using adaptive percentile filtering. The scanning occurs in real-time, and the auto-focusing is performed continuously during scanning. The filtering removes a portion of the noise from the images received by the sensors. The undesirable noise extraneous reflections from the underlying layers of the substrate result from the reflection of the laser beams off of the metallic material. The filtering removes a plurality of the noise from the images and results in enhanced accuracy for autofocusing, reducing the instances of the formation of mura and other undesirable effects in the display. By scanning over patterned substrates, an image is generated of a low-frequency photoresist signal and of time-varying high-frequency metal signals. Therefore, across scanning windows that are larger than the feature size of the pattern, the photoresist signal will be approximately constant, while the metal signals will not. Further, the photoresist and metal signals are positive and additive. Because the metal reflections are changing rapidly, this means that, without sensor noise, taking the minimum pixel value (e.g., pixel height) of a series of frames would result in the closest approximation of the photoresist signal (i.e. high-frequency metal-induced signals will be removed). Furthermore, there is a small amount of both positive and negative sensor noise generated during autofocusing. As such, by determining a predetermined percentile of noise to remove from the plurality of images, there is a more accurate, real-time autofocus determination made for each substrate that balances eliminating the (larger) metal noise without amplifying the smaller sensor noise. The autofocus inputs are multidimensional, including x coordinates and y coordinates over the substrates, the exposure source position, the linear sensor pixel position, and a light intensity. As discussed herein, either or both of a stage on which a substrate is positioned in the imaging system and/or the exposure source can be moved in the x direction, the y direction, or the z direction during the autofocusing operation.

Conventional technology can determine a peak of a graph of pixel amplitude (height) for each of n pixels across a substrate. The peak may be a format in which the CMOS or other image sensors of the imaging system provide the reflected light. However, using the autofocus systems and methods discussed herein performs a centroid calculation to determine a mean, e.g., not necessarily a peak, of the pixel amplitude curves. This is discussed below and shown in FIGS. 6A-6D. Each sensor of the plurality of sensors of the imaging system produces at least one image for each pixel on the substrate. The images are combined and analyzed among and between substrates and a centroid is determined for each image generated from each sensor of plurality of sensors. A centroid is a center of mass measurement that multiplies each pixel by its position (height) and dividing that number by a total number of pixels scanned to determine a center measurement of pixel height (e.g., an average). That is, each pixel has, for example, three lasers applied to it, and each sensor is configured to capture an image from each laser. Thus, each pixel produces 3 images, and the images from each sensor are combined to form an image of the substrate. The centroid discussed herein is a center of mass measurement for the plurality of images received by each sensor and is assumed to have a Gaussian distribution. The centroids are used to determine a focus deviation, that is, how an initial position of the exposure source relative to the substrate differs from a second, exposure, position for the exposure source that will be used to pattern the substrate. The centroid offset from the target substrate and the current stage position is used to estimate a height of the substrate. The centroids calculated for each sensor as discussed herein are combined using a filter such as a Kalman filter, a linear filter, or a PID filter as discussed below to generate a model estimation of the exposure position. The calculation and the model can be combined and/or compared to determine the exposure position as discussed below.

FIG. 1A is a perspective view of a photolithography system 100A according to embodiments disclosed herein.

The system 100A includes a base frame 110, a slab 120, a stage 130, and a processing apparatus 160. The base frame 110 rests on the floor of a fabrication facility and supports the slab 120. A plurality of passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example, quartz, is used as part of a flat panel display. In other embodiments, the substrate 140 is made of other materials capable of being used as a part of the flat panel display. In some embodiments, the substrate 140 has a photoresist layer formed thereon which is sensitive to radiation. A positive photoresist includes portions of the photoresist, which, when exposed to radiation, are respectively soluble to a photoresist developer applied to the photoresist after the pattern is written into the photoresist. A negative photoresist includes portions of the photoresist, which, when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. In this manner, the pattern is created on a surface of the substrate 140 to form the electronic circuitry.

The system 100A includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the stage 130 moves along the tracks 124 in the X-direction as indicated by the coordinate system shown in FIG. 1A. In one embodiment, the pair of tracks 124 is a pair of parallel magnetic channels. As shown, each track 124 of the pair of tracks 124 is linear. In other embodiments, one or more track 124 is non-linear. An encoder 126 is coupled to the stage 130, the encoder 126 is configured to provide location information to a controller 190.

In an embodiment, the processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatuses (shown in FIGS. 2A and 2B). In one embodiment, the processing unit 164 contains as many as 84 image projection apparatus. Each image projection apparatus is disposed in a case 165. The processing apparatus 160 is useful to perform maskless direct patterning.

The controller 190 facilitates the control and automation of the processing techniques described herein. The controller 190 is coupled to or in communication with one or more of the processing apparatus 160, the one or more stages 130, and the encoder 126. The processing apparatus 160 and the one or more stages 130 provide information to the controller regarding the substrate processing and alignment. For example, the processing apparatus 160 provides information to the controller 190 to alert the controller 190 that substrate processing is complete. In another example, the controller 190 is configured to execute a plurality of instructions to determine an exposure position for the imaging apparatus in real-time by scanning the substrate pixel-by-pixel to autofocus the exposure source prior to exposure (patterning) of the substrate. In one example, the controller 190 adjusts the one or more stages 130 to an initial position when a substrate is positioned on or in the one or more stages. In still another example, the controller 190 is configured to execute a plurality of instructions to determine a velocity of the exposure scanning and an exposure position for the imaging apparatus in real-time by scanning the substrate pixel-by-pixel to autofocus the exposure source prior to exposure (patterning) of the substrate.

The controller 190 includes a central processing unit (CPU) 192, memory 194, and support circuits (or I/O) 196. The CPU 192 is one of any form of computer processors used in industrial settings for controlling various processes and hardware (e.g., pattern generators, motors, and other hardware) and/or monitoring the processes (e.g., processing time and substrate position). The memory 194 is connected to the CPU 192. The memory 194 is one or more of a readily available memory, such as random access memory (RAM), read only memory (ROM), floppy disk, hard disk, or any other form of digital storage, local or remote. Software instructions and data are coded and stored within the memory 194 for instructing the CPU 192. The support circuits 196 are also connected to the CPU for supporting the processor in a conventional manner. The support circuits include conventional cache, power supplies, clock circuits, input/output circuitry, subsystems, and the like. A program (or computer instructions), which may be referred to as an imaging program, is readable by the controller determines which tasks are performable on a substrate. The program is software readable by the controller and includes code to monitor and control, for example, the processing time and substrate position.

During operation, the stage 130 moves in the X-direction at a predetermined velocity from a loading (first) position, as shown in FIG. 1A, to a processing (second) position. The processing position is one or more positions of the stage 130 as the stage 130 passes under the processing unit 164. During operation, the stage 130 is be lifted by a plurality of air bearings (not shown) and the stage 130 moves while lifted along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system (not shown) measures the X and Y lateral position coordinates of each of the stage 130 in real-time so that each of the plurality of image projection apparatuses can accurately locate the patterns being written in a photoresist-covered substrate 140. The metrology system also provides a real-time measurement of an angular position of the stage 130 about the vertical or Z-axis. The angular position measurement may be used to hold the angular position of the stage 130 constant during scanning by means of a servo mechanism (not shown), or the angular position measurement may be used to apply corrections to the positions of the patterns being written on the substrate 140 by the image projection apparatus 200A and 200B, shown in FIGS. 2A-2B and discussed below. In some examples, these techniques may be used in combination.

Figure 1B:
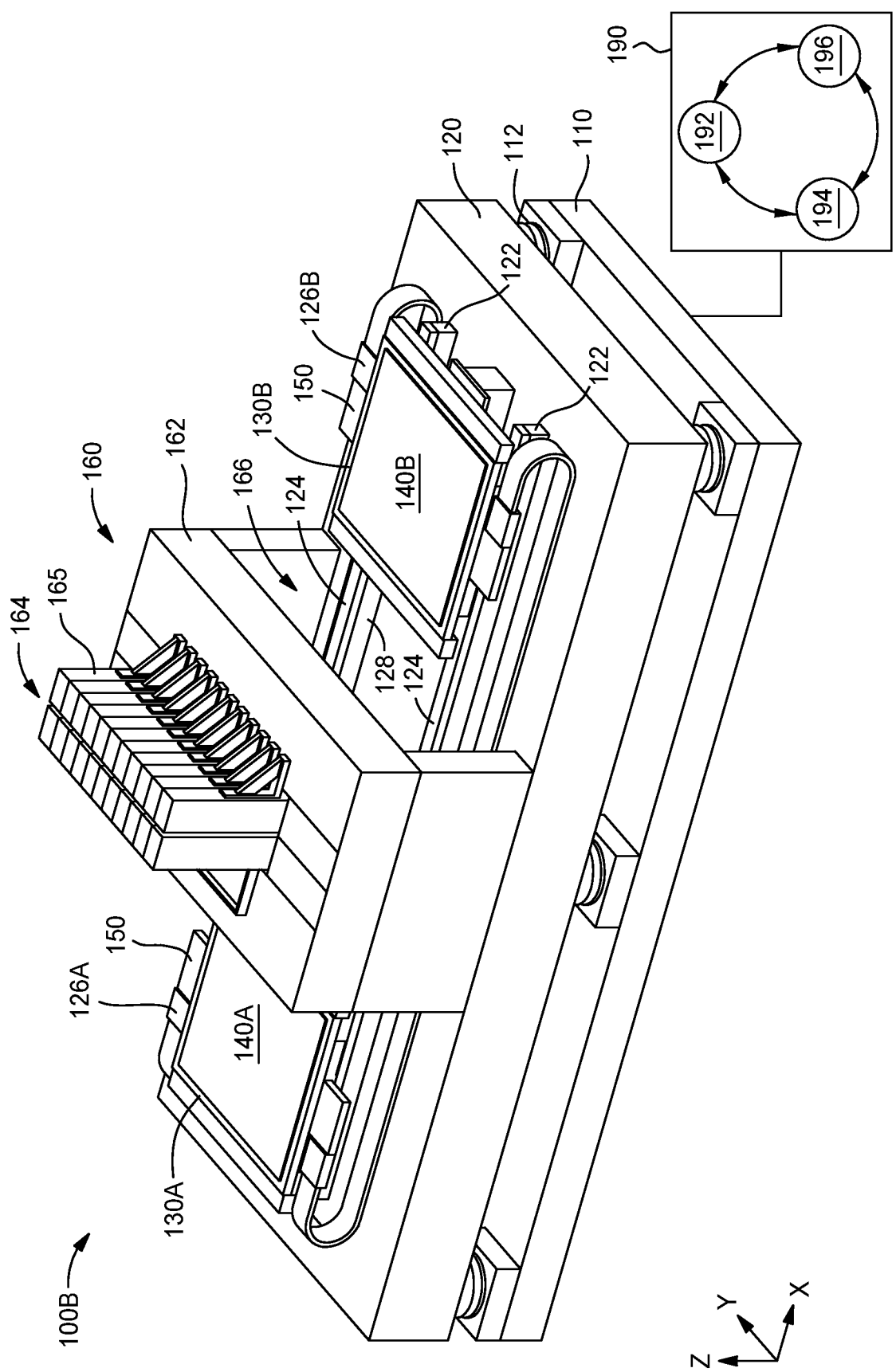
FIG. 1B is a perspective view of an alternate photolithography system according to embodiments disclosed herein.

FIG. 1B is a perspective view of a photolithography system 100B according to embodiments disclosed herein. The system 100B is similar to the system 100A; however, the system 100B includes a first stage 130A and a second stage 130B. Each of the two stages 130A and 130B is capable of independent operation such that the system can scan a substrate 140A or 140B in a first direction and step in a second, other direction. In some embodiments, when one of the two stages 130A or 130B is scanning a substrate 140, the other of the two stages 130A or 130B is unloading an exposed substrate and loading the next substrate to be exposed. In one example, the first stage 130A scans the substrate 140A, and the second stage 130B unloads an exposed substrate 140B and loads the next substrate (not shown) to be exposed. Also shown in FIG. 1B are the first and second encoders 126A and 126B, respectively co-located with stages 130A and 130B.

While FIGS. 1A-1B each depict an embodiment of a photolithography system (100A and 100B, respectively), other systems and configurations are also contemplated herein. For example, photolithography systems including any suitable number of stages (e.g., 3 or more stages 130) are also contemplated.

Figure 2A:
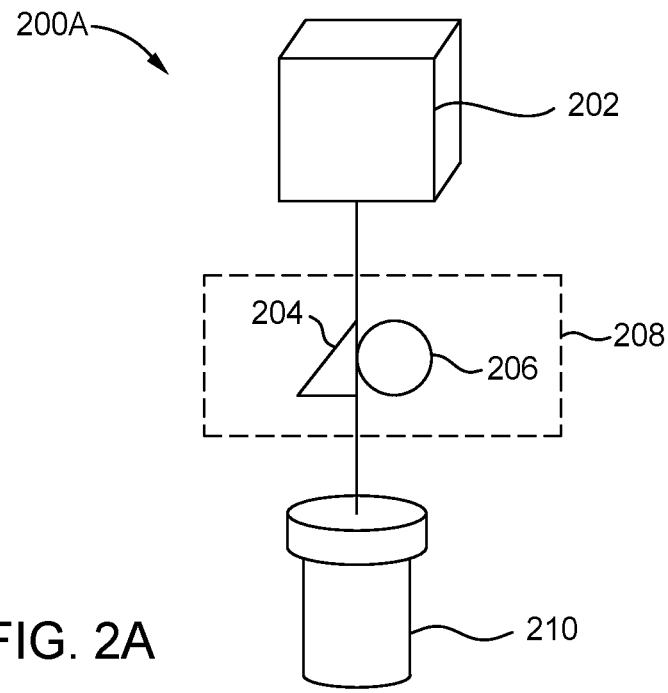
FIG. 2A is a perspective schematic view of an image projection apparatus according to embodiments disclosed herein.

FIG. 2A is a perspective schematic view of an image projection apparatus 200A according to one embodiment. The image projection apparatus 200A may be useful for a photolithography system, such as system 100A or 100B in FIGS. 1A and 1B. The image projection apparatus 200A includes one or more spatial light modulators 202, an alignment and inspection system 208 including a focus sensor 204 and a camera 206, and a plurality of projection optics 210. In some examples, the image projection apparatus 200A can be referred to as a "channel." The components of the image projection apparatus 200A may vary depending on a type of spatial light modulator 202 being used. Spatial light modulators 202 include, but are not limited to, solid state emitters, digital micromirror devices (DMDs), vertical-cavity surface-emitting lasers (VCSELs), liquid crystal displays (LCDs), and other solid state emitters of electromagnetic radiation. Solid state emitters emit electromagnetic radiation and are microscopic, for example, less than about 100 μm at the largest dimension. In some examples, light emitting diodes such as microLEDs may be employed. Various examples of solid state emitter devices can be arranged in arrays in an exposure source of an imaging system used for digital photolithography. Each solid state emitter may be associated with at least one pixel of the display. In some embodiments, a plurality of sub-pixels may be associated with each pixel. The solid state emitters discussed herein emit electromagnetic radiation and may be used in light-emitting devices (LEDs), uLEDs, vertical-cavity surface-emitting lasers (VCSEL), and other devices. Various voltages may be used, depending upon the type of solid state emitter used. In examples where a uLED is employed, a voltage applied may be from 100 mV to 7 V.

In operation, the spatial light modulator 202 is used to emit light and/or modulate one or more properties of the light, such as an amplitude, a phase, or a polarization of the light, which is projected through the image projection apparatus 200A and to a substrate, such as the substrate 140 in FIG. 1A. The alignment and inspection system 208 is used for alignment and inspection of the components of the image projection apparatus 200A or 200B. In one embodiment, the focus sensor 204 includes a plurality of lasers which are directed through the lens of the camera 206 and then back through the lens of the camera 206 and imaged onto sensors to detect whether the image projection apparatus 200A is in focus. The camera 206 is used to image the substrate, such as substrate 140, including to ensure the alignment of the image projection apparatus 200A and photolithography system 100A or 100B is correct or within an predetermined tolerance. The projection optics 210, such as one or more lenses, is used to project the (modulated or unmodulated) light onto the substrate, such as the substrate 140.

Figure 2B:
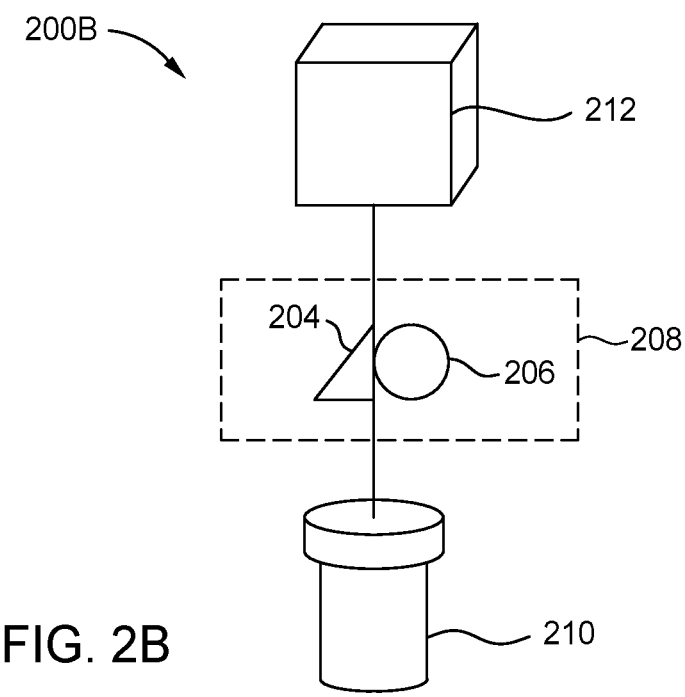
FIG. 2B is an image projection apparatus according to embodiments described herein.

FIG. 2B is an image projection apparatus 200B according to embodiments described herein. In the embodiment shown in FIG. 2B, the image projection apparatus 200B, which can also be referred to as a "channel," similarly to the image projection apparatus 200A, includes a solid state emitter device 212 as the spatial light modulator(s), a focus sensor 204 and inspection system 208 and projection optics 210. In one embodiment, the image projection apparatus 200B further includes a beamsplitter (not shown). The autofocusing discussed herein employs the image projection apparatuses of FIGS. 2A and 2B, utilizing the image data collected to autofocus the projection optics 210 prior to patterning the substrate to avoid the formation of mura.

Figure 3:
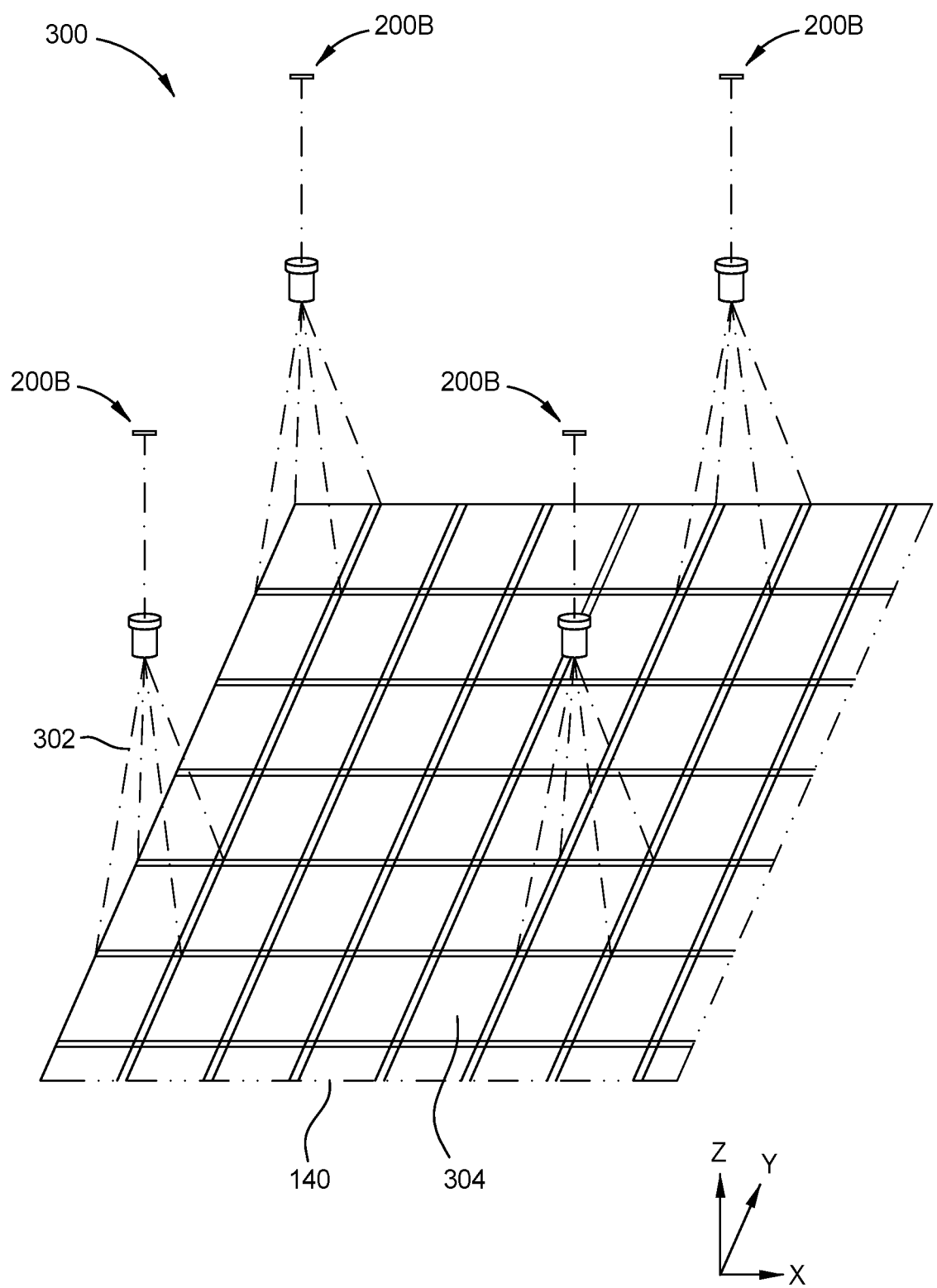
FIG. 3 illustrates a schematic view of a plurality of image projection apparatuses according to embodiments of the present disclosure.

FIG. 3 illustrates a schematic view 300 of a plurality of image projection apparatuses 200B. It is to be understood that while image projection apparatus 200B are shown, it is contemplated that image projection apparatus 200A may be used either in place of or in addition to the image projection apparatus 200B. The plurality of image projection apparatuses 200B may be used in a photolithography system, such as systems 100A and 100B. In operation, each image projection apparatus 200B produces a plurality of write beams 302 onto a surface 304 of the substrate 140. As the substrate 140 moves in the X-direction and/or the Y-direction, as indicated by the coordinate system in FIG. 3, the surface 304 (e.g., an entire surface across a substrate 140 from edge to edge) is patterned by the write beams 302. In various embodiments, the number of image projection apparatuses 200B included in the system varies based on factors such as the size of the substrate 140 and/or the speed of the one or more stages 130 (as shown in FIGS. 1A and 1B).

Figure 4:
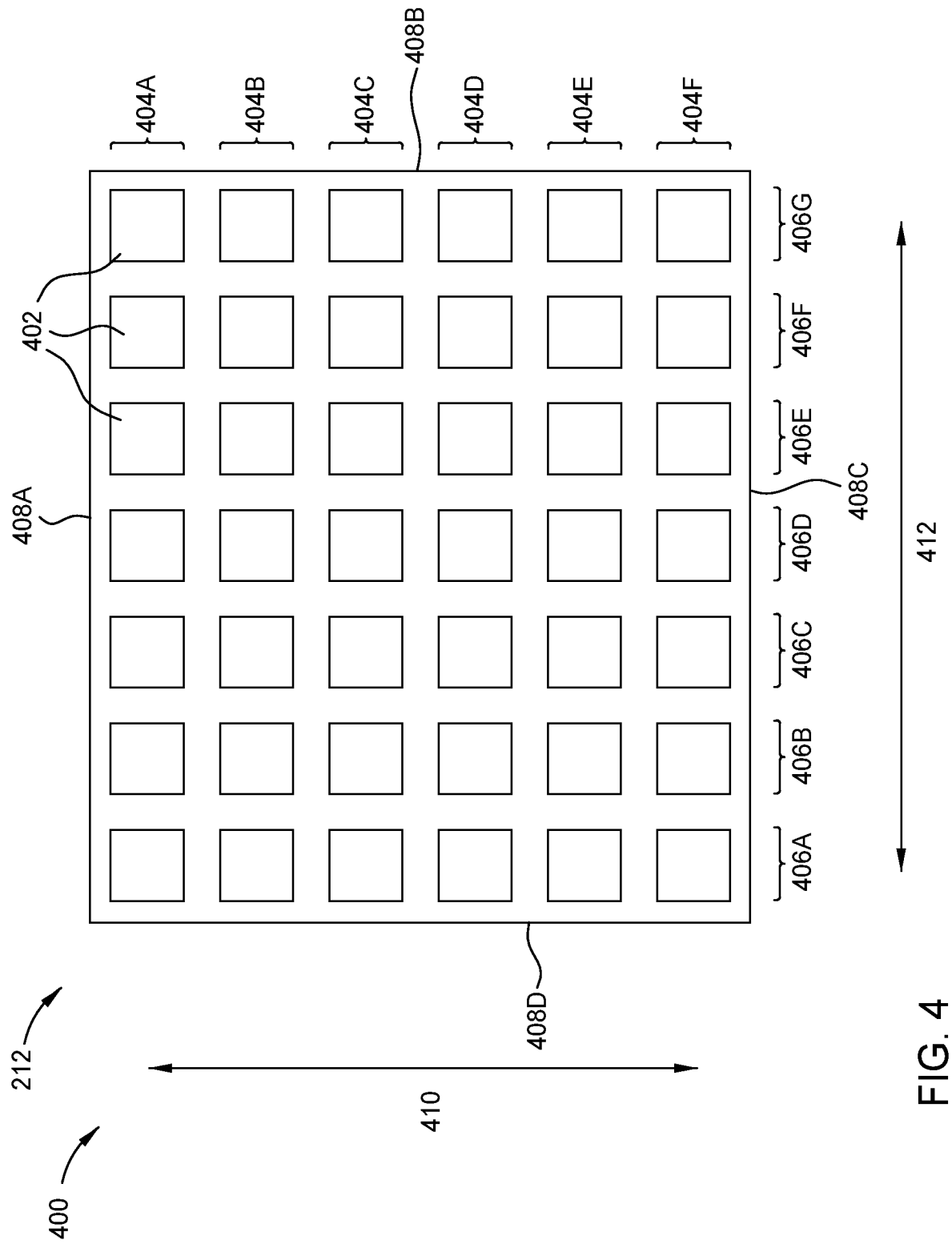
FIG. 4 is a partial schematic illustration of a solid state emitter device according to embodiments of the present disclosure.

Turning to FIG. 4, an example 400 of a solid state emitter device 212 is shown. As shown in FIG. 4, the solid state emitter device 212 includes a plurality of solid state emitters 402 in an array. Since solid state emitters are self-emitting, an outside light source is not included in the image projection apparatus 200B that illustrates the solid state emitter device 212. Additionally, unlike DMD micromirrors which are configurable between an "on" and "off" state, each solid state emitter has a variable intensity which enables an enhanced grayscale controllability. The solid state emitter device 212 may comprise 4 sides, which may be referred to as "edges" herein. The "edge" is a physical boundary of the substrate, and each solid state emitter device 212 may comprise four edges, a first edge 408A, a second edge 408B, a third edge 408C, and a fourth edge 408D. In some examples, the first edge 408A may be referred to as a "north" edge, the second edge 408B may be referred to as a "west" edge, the third edge 408C may be referred to as a "south" edge, and the fourth edge 408D may be referred to as an "east" edge. Thus, references to the "north-south" adjustability or directionality references a direction 410 from 408A to 408C (and 408C to 408A), and references to "east-west" adjustability of directionality references a direction 412 from 408B to 408D (and 408D to 408B). The east-west adjustability discussed herein refers to the tunability of a voltage that is applied to the solid state emitter device 212 as well as the tunability of a gate bias (which may be set to 0 or to greater than 0). In one example, as substrate moves from the fourth edge 408D to the second edge 408B, and both the substrate and solid state emitter device 212 are substantially the same shape if not the same size, a plurality of "stripes" are formed when the voltage is received by some of the emitters from the solid state emitter device 212. In some examples, the substrate is larger than the solid state emitter device 212 and a plurality of passes of the solid state emitter device 212 are made over the substrate.

The solid state emitters 402 are arranged in an array comprising a plurality of rows 404A-404F and a plurality of columns 406A-406G. While six rows and seven columns are shown in FIG. 4 as an example, in other embodiments, a solid state emitter device 212 may include millions of solid state emitters 402, each of which corresponds to a pixel in a display. For example, one embodiment of a solid state emitter device has a size of 1024 by 2048 pixels. Various pulses can be applied to the plurality of rows 404A-404F and/or columns 406A-406G, or to individual solid state emitters 402, or to groups of solid state emitters 402 other than the rows and columns discussed herein. The application of pulses to the solid state emitter device 212 across various regions of a substrate in either direction 410 and/or 412 thereby forms a plurality of patterned features on the substrate of a desired (target) feature size. In alternate embodiments, pulses can be applied to individual solid state emitters 402, or to groups of solid state emitters other than the rows and columns illustrated in FIG. 4.

Autofocusing the imaging apparatus includes capturing images using three focus (laser) beams, which can be part of imaging projection apparatuses referred to herein as channels. Each laser beam is applied to each pixel across a substrate in real-time. The image pre-processing discussed herein takes the images received by CMOS sensors of the imaging apparatus and removes a percentage of noise to account for the metal reflection noise, without amplifying the sensor noise. This enables the imaging system to capture multiple images of a substrate in a pixel-wise application to later sort an "n" number of pixels to eliminate a predetermined percentage of noise from the images. Subsequently, this filtered data is distilled to a single-point positional/height measurement via an estimation, then the centroids are determined for each sensor's images. This information is put into a filter such as a Kalman filter to track the substrate height over time in real-time and combine the centroid images to determine an exposure position, which the stage and/or the exposure source is adjusted to prior to exposure.

Figure 5:
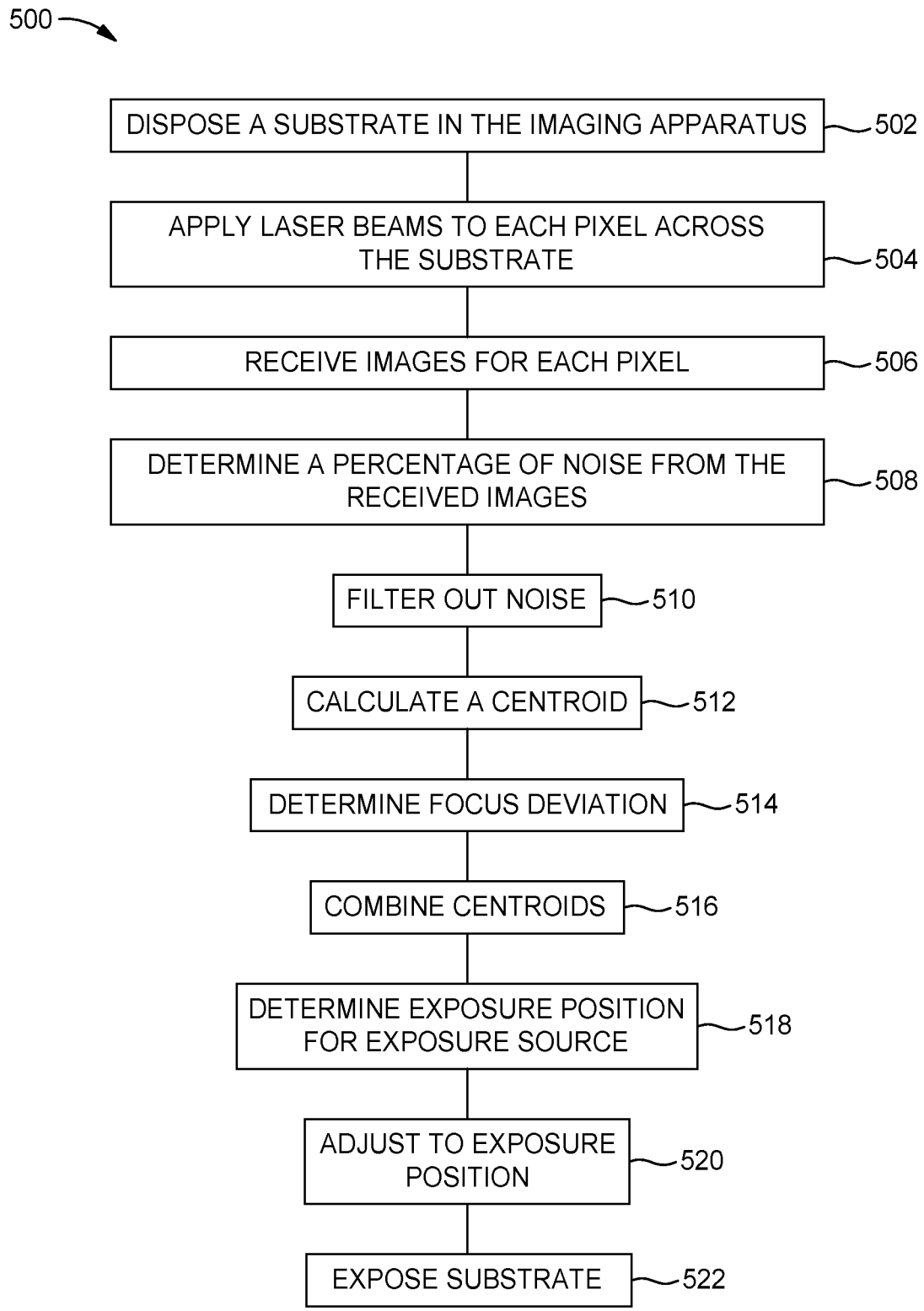
FIG. 5 is a flow chart of a method 500 of autofocusing on a substrate during a substrate patterning operation.

FIG. 5 is a flow chart of a method 500 of autofocusing on a substrate during a substrate patterning operation. In the method 500, at operation 502, a substrate is disposed in an imaging apparatus, such as the imaging apparatuses 102A in FIG. 1A or 102B in FIG. 1B. At operation 502, the substrate can be positioned on a stage in the imaging apparatus, such as the stage 130 in FIG. 1A or the stages 130A or 130B in FIG. 1B. The imaging apparatus is configured in an initial position at operation 502 with respect to a position of the stage relative to the exposure source.

At operation 504, a plurality of laser beams is applied to each pixel across the substrate. Each laser beam of the plurality of laser beams is configured to contact each pixel at a different angle. Subsequently, at operation 506, in response to the laser application at operation 504, a plurality of sensors such as the focus sensor 204 in FIG. 2 receive a plurality of images from each pixel across the substrate. The images received at operation 506 can be distorted due to noise because the reflection of the laser beams off of the metallic material can cause noise in the images that may inhibit autofocusing. In an embodiment, at operation 506, an initial (current) position of the exposure source is determined (e.g., in microns) and an offset value is determined in pixels. The images received at operation 506 are shifted by adding the offset determined to the image pointer. This can be a manner of taring the imaging system before determining the exposure position. Shifted images can be stored in a fixed-size priority queue for each pixel, such that for each pixel across a substrate, there is a buffer comprising a height value of that pixel, so the first pixel is frame N, the second pixel is frame N+1, and so on.

As such, at operation 508, the images are analyzed to determine a percentage of noise to filter. The percentage of noise to be filtered can depend on a plurality of factors, including an intensity of the laser beams and whether the laser beams are hitting photoresist material or metallic material under the photoresist. In an embodiment, the percentage of noise to filter from the received images is from 1% to 30%, or from 5% to 25%, or from 10% to 20%, or other ranges as appropriate. The filtered noise discussed herein is non-Gaussian noise, that is, noise that has a probability density function is outside of a normal statistical distribution (Gaussian distribution).

At operation 510, the images are filtered to remove the percentage of noise determined at operation 508. Filtering the noise through the pre-processing including operations 508 and 510 aids in autofocusing the imaging system because filtering the noise removes a portion of the reflection of the metallic content that can cause the exposure position measurements to be incorrect, thus resulting in mura. The percentage of noise filtered at operation 510 can be from 0% to 30% or greater.

At operation 512, subsequent to filtering out the noise at operation 510 and using the filtered images, a centroid of the reflection at a best-focus position is taken to determine a target centroid value to use for adjustment prior to exposure. That is, one centroid is calculated for each sensor's images. The centroid calculation at operation 512 comprises a background brightness measurement and a brightness threshold, each of which are subtracted from the image prior to calculating the centroid. When the exposure source is autofocused, the laser beams (focus beams) reflect on to specific locations on the CMOS sensor(s) associated with each beam. The magnitude and direction of the focus deviation, determined subsequently at operation 514, can be determined by converting the difference between the target centroid value and an actual centroid value to a z-axis deviation measured in microns, using a calibrated ratio of a z-height change to a sensor pixel shift.

At operation 514, based upon the determination of the centroids at operation 512, a focus deviation is determined. The focus deviation is determined because the position on the sensors that receive the images represent a relative distance of the exposure source and the substrate, e.g., based on a measurement of each pixel of the substrate. The focus deviation is a measurement of how the initial position of the exposure source relative to the substrate differs from a second, exposure position for the exposure source. The exposure position is the position the exposure source will be in during the exposure discussed below at operation 522.

At operation 516, the centroids calculated at operation 514 are combined to generate a model estimation of an exposure position. The combination of centroids is executed at operation 516 in order to combine the centroids as determined from each of the images from each of the sensors. The combination of centroids is performed at operation 516 using Kalman filtering, a proportional-integral-derivative filtering, or linear filtering. The Kalman filter combines multiple measurements from the sensors taken in real time, over time, to provide an estimate of the exposure position. Kalman filters can also be employed at operation 516 to weight measurement quality among and between each sensor.

In one example, a Kalman filter is used at operation 516 to combine the centroid calculations and determine an exposure position for the exposure source. A Kalman filter is a Bayesian statistical filter which combines a series of measurements over time using a system model and a measurement model to generate a single optimal estimate for the state of a system. In an embodiment, the Kalman filter is used at operation 516 to combine the measurements of the centroids from all three sensors, producing a single estimate of the substrate height. The use of the Kalman filter enables a model estimation that can be performed in real-time and knowledge such as the substrate composition, substrate size, and historical imaging data can be used in the Kalman filter to generate the model at operation 516. By combining measurements from all the three sensors, a model exposure position for in-focus exposure is determined at operation 516.

The exposure position, as discussed above, is a position of the exposure source relative to a position of the substrate, and can be defined in one or more of the x, y, and z directions. Depending upon the embodiment, and dependent in part upon an initial position of the substrate and the exposure source (e.g., 210 or 212 from FIGS. 2A and 2B), the exposure position and can be obtained by moving one or both of the exposure source or the stage (e.g., the stage 130 from FIG. 1). The Kalman filter takes "clean" data, the image data that has been filtered to remove a predetermined percentage of noise, from the images captured by the plurality of sensors, this data is viewed as an independent Gaussian distribution from each sensor and can be modeled. The measurement data taken via the laser beams is Gaussian noise and includes unknown measurement noises from various surface factors including composition (alloy, polymer, etc.) and composition of the substrate. The Kalman filtering at operation 516 produces a model estimation used to determine the exposure position along with the centroid calculation at operation 514.

At operation 518, based upon the combination of the centroids at operation 516 and the focus deviation determined at operation 514, an exposure position is determined. This determination can comprise comparing an offset determined at operation 504 and the focus deviation determined at operation 512 to the model generated using the Kalman filter at operation 516. In alternate embodiments, operation 518 can comprise further analysis to determine the exposure position. The pre-processing of the image data, including the removal of the noise at operation 508, provides for an autofocused exposure more easily and more reliably than conventional methods without compromising cycle times for the exposure operation. Further in the method 500, at operation 520, either the stage on which the substrate is positioned is moved or the exposure apparatus is moved (adjusted) to the exposure position determined at operation 518.

Depending upon the embodiment, when an exposure position is determined, the stage and/or an exposure source (e.g., solid state emitters such as the projection optics of FIG. 2A or the solid state emitter device 212 of FIG. 2B) can be moved in various directions to autofocus the exposure source on the substrate. The adjustment of, for example, the stage, to the exposure position comprises one or more of moving the stage along the x-axis, the y-axis, or the z-axis, and, in some embodiments, can comprise adjusting one side or one corner of the stage such that the stage is not parallel to the x-axis. At operation 522, subsequent to establishing the exposure position within the imaging apparatus, the substrate is exposed and patterned. In some examples, patterning the substrate comprises one or more exposures at operation 522, and some or all of operations 504-520 can be executed to determine an exposure position of subsequent exposures at operation 522. In an embodiment, operations 504-520 are executed in real-time in a time period from 0.3 ms to 5 ms, or from 0.5 ms to 3 ms, or from 0.8 ms to 1.2 ms, or other periods of time as appropriate for a predetermined number of pixels. The predetermined number of pixels can be from 2 to 100, 10 to 50, 5 to 10, or other ranges or targets of pixel counts as appropriate for the size and composition of the substrate. The one or more exposures at operation 522 are performed in-focus, resulting in a reduced likelihood and occurrence of mura.

Figure 6A:
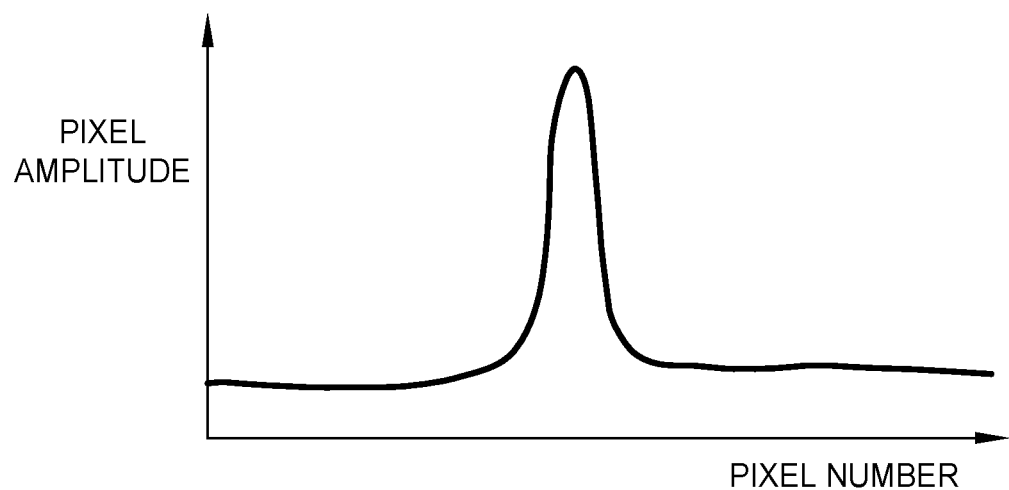
FIG. 6A is an example graph of reflected height intensity data across a substrate.

FIG. 6A is an example graph of pixel amplitudes measured for a plurality of pixels across a substrate. FIG. 6A shows the pixel amplitude (height) vs. a number of pixels associated with that height. FIG. 6A shows how many pixels are at a particular height, as measured for a plurality of pixels across a substrate. As one or more exposures can be performed to pattern a substrate using digital photolithography, the exposures discussed herein can be for an entire substrate or for portions of a substrate since the analysis and exposure position adjustments discussed herein are performed in real-time during substrate patterning. As noted above, conventional technology can determine a peak of the graph in 6A. However, the centroid of the substrate may not be the center of the peak, for example, if the peak is irregularly shaped. Using the autofocus systems and methods discussed herein performs a centroid calculation to determine a mean, e.g., not necessarily a peak, of the pixel amplitude curves is discussed.

Figure 6B:
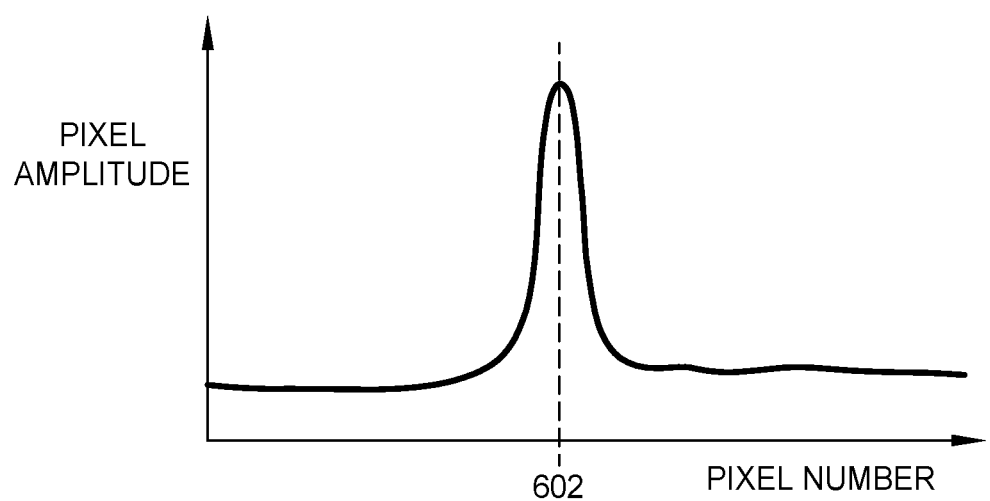
FIG. 6B shows an example graph of pixel height data across a substrate in an ideal case with a normal or near-normal Gaussian distribution.

FIG. 6B shows an example graph of pixel height data across a substrate in an ideal case with a normal or near-normal Gaussian distribution. FIG. 6B is an ideal case, so the center of the peak is about the mean of the data, labeled as the centroid line 602 in FIG. 6B. However, the image data obtained herein may not be ideal, for example, because of noise and/or because of the variation in height among and between pixels across a substrate that can be caused by various operations during device fabrication.

Figure 6C:
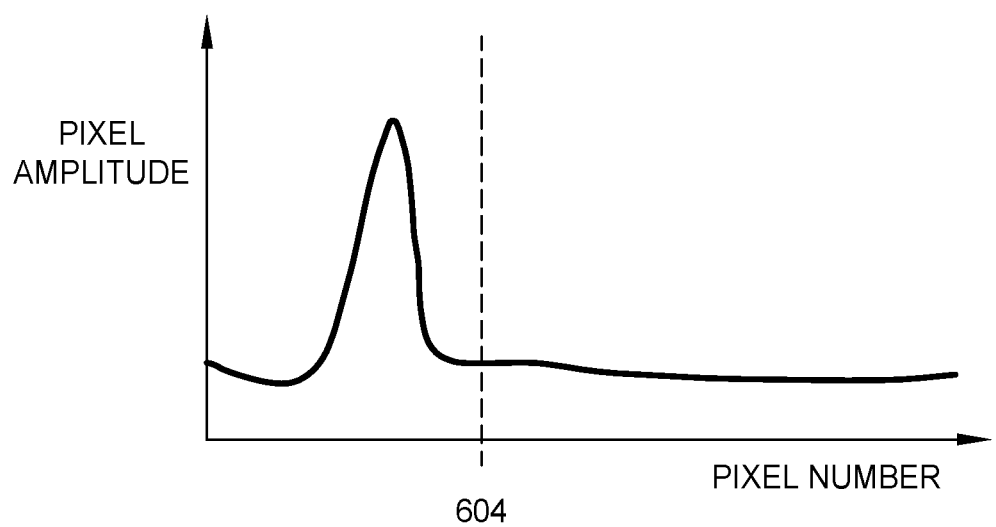
FIG. 6C illustrates a centroid calculation on an example graph that results in a centroid value offset from a center of the peak.

FIG. 6C illustrates a centroid calculation on an example graph that results in a centroid value offset from a center of the peak. FIG. 6C illustrates the use of an averaging operation across the full set of image capture data results across a substrate to determine a centroid 604, which is located outside of the peak.

Figure 6D:
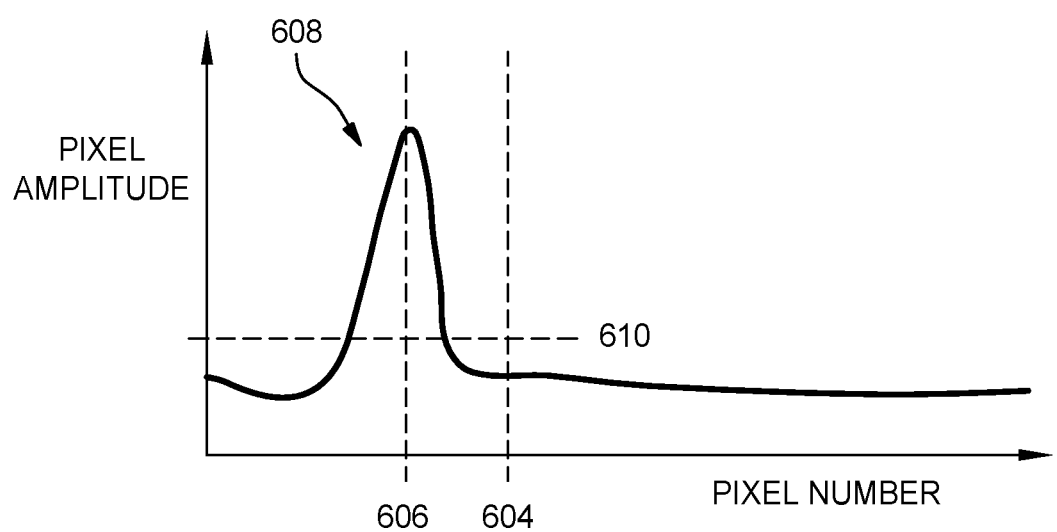
FIG. 6D illustrates an example graph of pixel height across a substrate and a centroid calculation according to embodiments of the present disclosure.

FIG. 6D illustrates an example graph of pixel height across a substrate and a centroid calculation according to embodiments of the present disclosure. FIG. 6D is the graph of FIG. 6C that shows the centroid 604 calculated using conventional methods and a second centroid 606 determined according to embodiments calculation for the centroid is performed on a subset of data indicated by the shaded box 608. FIG. 6D further illustrates removal of background noise below a threshold 610. In order to obtain a more accurate centroid value, using the filtered data discussed herein where a predetermined percentage of background noise has been removed from the data set, a subset of the image capture data is used for the centroid calculation. The background noise shown in FIGS. 6C and 6D and discussed with respect to FIGS. 6C and 6D can include noise from the metallic material as discussed above, and can be determined and subsequently filtered as discussed in the method 500 in FIG. 5. In alternate embodiments, the background noise indicated by 610 can include metallic material reflection and/or sensor noise or other background noise.

Embodiments and examples of the present disclosure can be combined in various combinations. In an example method of patterning a substrate, the method includes: applying a plurality of laser beams across a substrate while the substrate is positioned on a stage in an imaging apparatus in an initial position relative to an exposure source of the imaging apparatus, the substrate comprising a photoresist and a metallic material; receiving, by a plurality of sensors coupled to the imaging apparatus, in response to applying the plurality of laser beams, a plurality of images of each pixel of the plurality of pixels; and determining a percentage of noise in the plurality of images received from each sensor for each pixel of the plurality of pixels in response to the applying of the plurality of laser beams to the metallic material of the substrate. In this example, the method further includes filtering out the percentage of noise from the plurality of images from each sensor for each pixel of the plurality of pixels; subsequently, calculating a centroid of the substrate based on the plurality of images; determining, based on the calculating of the centroid for each sensor of the plurality of sensors, a focus deviation; and adjusting, the substrate to an exposure position from the initial position, the exposure position being different than the initial position, and the adjusting the exposure source autofocusing the exposure source on the substrate.

In some examples, which can be combined herein with other examples, the method further includes, subsequent to adjusting the substrate, exposing the substrate to the exposure source, wherein exposing the substrate forms a plurality of features in the substrate. Furthermore the method can include combining each centroid for each sensor of the plurality of sensors, wherein the combining comprises Kalman filtering, proportional-integral-derivative filtering, or linear filtering; and determining, based on the combining and the focus deviation, the exposure position of the exposure source.

In an example of the method, the substrate comprises a photoresist and a metallic material, and wherein the percentage of noise is noise in the plurality of images received in response to the plurality of laser beams reflecting off of the metallic material during the applying of the plurality of laser beams. In another example of the method, wherein percentage of noise is from 1% to 30%. In yet another example of the method, the method includes determining the centroid using a subset of the plurality of images.

In another example, a method of patterning a substrate includes: positioning, in an imaging apparatus, a substrate comprising a photoresist and a metallic material, the substrate being positioned on a stage in the imaging apparatus in an initial position relative to an exposure source of the imaging apparatus; and determining, by an application stored on a non-transitory memory of a server and executable by a processor, an exposure position for the imaging apparatus. The determining the exposure position includes applying a plurality of laser beams to each pixel of the plurality of pixels; receiving, by a plurality of sensors coupled to the imaging apparatus, a plurality of images from each pixel of the plurality of pixels in response to applying the plurality of laser beams; determining a percentage of noise of the plurality of images for each sensor for each pixel of the plurality of pixels; and filtering out the percentage of noise from the plurality of images from each sensor for each pixel of the plurality of pixels. The method can further include, subsequent to the filtering, calculating a centroid of the substrate for each sensor of the plurality of sensors; determining, based on the calculating of the centroid for each sensor of the plurality of sensors, a focus deviation; combining each centroid for each sensor; and determining, based on the combining and the focus deviation, the exposure position of the exposure source. The method can further include adjusting, by the application, at least one of the stage or the exposure source from the initial position to the exposure position, the exposure position being different than the initial position, and the adjusting the exposure source autofocusing the exposure source on the substrate.

In some examples, this method further includes, subsequent to adjusting the stage, exposing the substrate to the exposure source, wherein exposing the substrate forms a plurality of features in the substrate. In other examples, the combining includes Kalman filtering, proportional-integral-derivative filtering, or linear filtering. The substrate has a height across the substrate surface, as measured perpendicular to the substrate, is not uniform. The substrate includes a photoresist and a metallic material, and wherein the percentage of noise is noise in the plurality of images received in response to the plurality of laser beams reflecting off of the metallic material during the applying of the plurality of laser beams. The percentage of noise can be from 1% to 30%. The method further includes adjusting, by the application, a velocity of the substrate from a first velocity to a second velocity based on the combining and the focus deviation.

In an example, a non-transitory computer-readable medium includes instructions that are configured to cause a computing system to: determine an exposure position for an imaging apparatus. The determination of the exposure position includes causing the computing system to: apply a plurality of laser beams to each pixel of a plurality of pixels of a substrate; receive, by a plurality of sensors coupled to the imaging apparatus, a plurality of images from each pixel of the plurality of pixels in response to applying the plurality of laser beams; determine a percentage of noise of the plurality of images for each sensor for each pixel of the plurality of pixels; filter out the percentage of noise from the plurality of images from each sensor for each pixel of the plurality of pixels; subsequently, calculate a centroid of the substrate for each sensor of the plurality of sensors; determine, based on the calculation of the centroid for each sensor of the plurality of sensors, a focus deviation; combine each centroid for each sensor; and determine, based on the combination and the focus deviation, the exposure position of an exposure source. The computing system can be further configured to adjust the substrate to the exposure position from an initial position, the exposure position being different than the initial position, and the adjustment of the exposure source autofocuses the exposure source on the substrate. The instructions are further configured to, subsequent to adjustment of the substrate, expose the substrate to the exposure source to form a plurality of features on the substrate. In some examples, the instructions are further configured to combine each centroid by Kalman filtering, proportional-integral-derivative filtering, or linear filtering. The substrate a height across the substrate surface, as measured perpendicular to the substrate, is not uniform. The substrate includes a photoresist and a metallic material, and wherein the percentage of noise is noise in the plurality of images received in response to the plurality of laser beams reflecting off of the metallic material during the applying of the plurality of laser beams. In some examples, the percentage of noise is from 1% to 30%, and, in other examples, the percentage of noise is from 5% to 20%.

Using the systems and methods discussed herein, digital lithography imaging systems are autofocused on maskless substrates in real-time by performing a pixel-wise analysis of height variation of pixels across a substrate that comprises a photoresist as well as metallic material. The analysis is performed using three laser beams and three sensors, each of which receives images from each pixel across the substrate when the substrate is positioned on a stage in an initial position relative to an exposure source of the imaging system. A predetermined percentage of noise is filtered out from the images collected, and the filtered images are analyzed to determine a centroid. The centroids are used to determine an offset from the initial position that will contribute towards autofocusing of the imaging system during exposure. The filtered data is analyzed to determine an exposure position, including determining centroids for each sensor and combining the centroids using, for example, a Kalman filter. When the imaging apparatus is adjusted to the exposure position, the exposure source is autofocused on the substrate as to reduce or eliminate the occurrence of mura and other undesirable features resulting from an unfocused exposure.

While the foregoing is directed to embodiments of the present disclosure, other and further embodiments of the disclosure may be devised without departing from the basic scope thereof, and the scope thereof is determined by the claims that follow.

What is claimed is:

1. A method of patterning a substrate, comprising:
applying a plurality of laser beams across a substrate while the substrate is positioned on a stage in an imaging apparatus in an initial position relative to an exposure source of the imaging apparatus, the substrate comprising a photoresist and a metallic material;
receiving, by a plurality of sensors coupled to the imaging apparatus, in response to applying the plurality of laser beams, a plurality of images of each pixel of a plurality of pixels;
determining a percentage of noise in the plurality of images received from each sensor for each pixel of the plurality of pixels in response to the applying of the plurality of laser beams to the metallic material of the substrate;
filtering out the percentage of noise from the plurality of images from each sensor for each pixel of the plurality of pixels;
subsequently, calculating a centroid of the substrate based on the plurality of images;
determining, based on the calculating of the centroid for each sensor of the plurality of sensors, a focus deviation;
adjusting, the substrate to an exposure position from the initial position, the exposure position being different than the initial position, and the adjusting the exposure source autofocusing the exposure source on the substrate; and
subsequent to adjusting the substrate, exposing the substrate to the exposure source, wherein exposing the substrate forms a plurality of features in the substrate.

2. The method of claim 1, further comprising:
combining each centroid for each sensor of the plurality of sensors, wherein the combining comprises Kalman filtering, proportional-integral-derivative filtering, or linear filtering; and
determining, based on the combining and the focus deviation, the exposure position of the exposure source.

3. The method of claim 1, wherein the substrate comprises a photoresist and a metallic material, wherein the percentage of noise is noise in the plurality of images received in response to the plurality of laser beams reflecting off of the metallic material during the applying of the plurality of laser beams, and wherein percentage of noise is from 1% to 30%.

4. The method of claim 1, further comprising determining the centroid using a subset of the plurality of images.

5. A method of patterning a substrate, comprising:
positioning, in an imaging apparatus, a substrate comprising a photoresist and a metallic material, the substrate being positioned on a stage in the imaging apparatus in an initial position relative to an exposure source of the imaging apparatus;
determining, by an application stored on a non-transitory memory of a server and executable by a processor, an exposure position for the imaging apparatus, the determining the exposure position comprising:
applying a plurality of laser beams to each pixel of the plurality of pixels;
receiving, by a plurality of sensors coupled to the imaging apparatus, a plurality of images from each pixel of the plurality of pixels in response to applying the plurality of laser beams;
determining a percentage of noise of the plurality of images for each sensor for each pixel of the plurality of pixels;
filtering out the percentage of noise from the plurality of images from each sensor for each pixel of the plurality of pixels;
subsequently, calculating a centroid of the substrate for each sensor of the plurality of sensors;
determining, based on the calculating of the centroid for each sensor of the plurality of sensors, a focus deviation;
combining each centroid for each sensor; and
determining, based on the combining and the focus deviation, the exposure position of the exposure source; and
adjusting, by the application, at least one of the stage or the exposure source from the initial position to the exposure position, the exposure position being different than the initial position, and the adjusting the exposure source autofocusing the exposure source on the substrate.

6. The method of claim 5, further comprising, subsequent to adjusting the stage, exposing the substrate to the exposure source, wherein exposing the substrate forms a plurality of features in the substrate.

7. The method of claim 5, wherein the combining comprises Kalman filtering, proportional-integral-derivative filtering, or linear filtering.

8. The method of claim 5, wherein the substrate comprises a photoresist and a metallic material, wherein the percentage of noise is noise in the plurality of images received in response to the plurality of laser beams reflecting off of the metallic material during the applying of the plurality of laser beams, and wherein the percentage of noise is from 1% to 30%.

9. The method of claim 5, further comprising, adjusting, by the application, a velocity of the substrate from a first velocity to a second velocity based on the combining and the focus deviation.

10. A non-transitory computer-readable medium including instructions that are configured to cause a computing system to:
  determine an exposure position for an imaging apparatus, the determining the exposure position comprising:
    apply a plurality of laser beams to each pixel of a plurality of pixels of a substrate;
    receive, by a plurality of sensors coupled to the imaging apparatus, a plurality of images from each pixel of the plurality of pixels in response to applying the plurality of laser beams;
    determine a percentage of noise of the plurality of images for each sensor for each pixel of the plurality of pixels;
    filter out the percentage of noise from the plurality of images from each sensor for each pixel of the plurality of pixels;
    subsequently, calculate a centroid of the substrate for each sensor of the plurality of sensors;
    determine, based on the calculation of the centroid for each sensor of the plurality of sensors, a focus deviation;
    combine each centroid for each sensor; and
    determine, based on the combination and the focus deviation, the exposure position of an exposure source; and
  adjust the substrate to the exposure position from an initial position, the exposure position being different than the initial position, and the adjustment of the exposure source autofocuses the exposure source on the substrate.

11. The non-transitory computer-readable medium of claim 10, wherein the instructions are further configured to, subsequent to adjustment of the substrate, expose the substrate to the exposure source to form a plurality of features on the substrate.

12. The non-transitory computer-readable medium of claim 10, wherein the instructions are further configured to combine each centroid by Kalman filtering, proportional-integral-derivative filtering, or linear filtering.

13. The non-transitory computer-readable medium of claim 10, wherein the substrate comprises a photoresist and a metallic material, wherein the percentage of noise is noise in the plurality of images received in response to the plurality of laser beams reflecting off of the metallic material during the applying of the plurality of laser beams, and wherein the percentage of noise is from 1% to 30%.

14. The non-transitory computer-readable medium of claim 10, wherein the percentage of noise is from 5% to 20%.

15. The non-transitory computer-readable medium of claim 14, wherein a height of a top surface across the substrate, as measured perpendicular to the substrate, is not uniform.

* * * * *